United States Patent [19]

Hult et al.

[11] Patent Number: 4,551,418
[45] Date of Patent: Nov. 5, 1985

[54] PROCESS FOR PREPARING NEGATIVE RELIEF IMAGES WITH CATIONIC PHOTOPOLYMERIZATION

[75] Inventors: Anders Hult, Täby, Sweden; Hiroshi Ito, San Jose, Calif.; Scott A. MacDonald, San Jose, Calif.; Carlton G. Willson, San Jose, Calif.

[73] Assignee: International Business Machines Corporation, Armonk, N.Y.

[21] Appl. No.: 702,514

[22] Filed: Feb. 19, 1985

[51] Int. Cl.$^4$ .............................................. G03C 5/00
[52] U.S. Cl. .................................. 430/325; 430/313; 430/314; 430/322; 430/323; 430/311; 156/643; 156/659.1; 156/904

[58] Field of Search ............... 430/313, 314, 322, 325, 430/311, 323; 156/646, 643, 904, 659.1

[56] References Cited

U.S. PATENT DOCUMENTS 4,175,963 11/1979 Crivello .............................. 430/280
4,307,177 12/1981 Crivello .............................. 430/225
4,426,247 1/1984 Tamamura et al. .................. 430/317

Primary Examiner—Jack P. Brammer
Attorney, Agent, or Firm—Joseph G. Walsh

[57] ABSTRACT

Negative relief images are generated by a process comprising the use of cationic polymerization and plasma etching.

14 Claims, 1 Drawing Figure

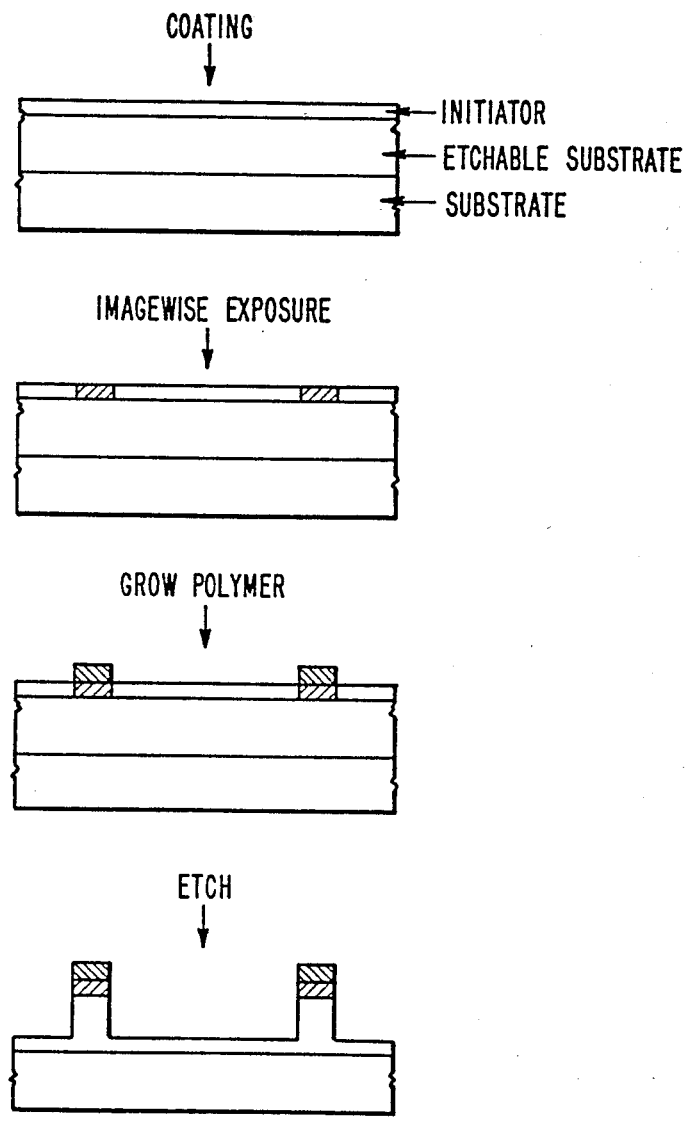

PROCESS FOR PREPARING NEGATIVE RELIEF IMAGES WITH CATIONIC PHOTOPOLYMERIZATION

DESCRIPTION

1. Technical Field

The present invention is concerned with a process for generating a negative relief image. The process allows convenient generation of high resolution, high aspect ratio relief structures useful in semiconductor manufacturing.

2. Background Art

U.S. Pat. No. 4,426,247 shows a multi-step process for obtaining micropatterns. The process of that patent involves radical addition graft polymerization, and involves steps different from those of the present invention.

U.S. Pat. No. 4,175,963 shows a process involving cationic polymerization, but the patent is entirely silent on the preparation of relief images.

DISCLOSURE OF THE INVENTION

According to the present invention, a negative tone relief image is generated by carrying out the following steps:
1. A substrate is coated with a film of cationic photoinitiator;
2. The initiator film is imagewise exposed to produce cationic initiator species;
3. The film is then contacted with a monomer that is susceptible to cationic polymerization, and forms a polymer resistant to plasma etching;
4. The film is then placed into a plasma environment. The unexposed areas of the film are etched by plasma treatment, but the exposed areas are not etched. This results in a high resolution negative tone relief image.

The substrate may be inorganic or organic in nature. The process can, for example be carried out directly on semiconductor substrates or semiconductor substrates that have been coated with an etchable substrate such as an organic polymer planarizing layer.

DESCRIPTION OF THE DRAWINGS

An understanding of the process may be obtained by an inspection of the drawings. The drawings (not to scale) are a diagrammatic representation of an embodiment of the steps of the process.

A substrate (such as silicon) is coated with an etchable substrate such as a polymeric layer containing (at least on its surface) a cationic photoinitiator. The photoinitiator is next imagewise exposed to radiation, and then contacted with a monomer which polymerizes. The film is then plasma etched to form a negative tone relief image.

The process used in the present invention can take several forms. The coating process step can be carried out in several ways: (a) the pure initiator can be applied directly to the substrate by spin coating, spraying or roller coating from solution; (b) certain initiators can be applied by direct evaporation or sputtering in vacuo; or (c) the initiator can be applied in a carrier (host) polymer by the usual coating techniques.

A preferred material for the substrate is silicon. Also useful are the oxides and nitrides of silicon.

The exposure can be carried out over a wide range of the electromagnetic spectrum from x-radiation to visible light or by electron beams, depending upon the structure of the initiator and the use of dye sensitizers well known in the art.

The exposure can be carried out under ambient conditions and the exposed substrates/films can be transported and stored under normal atmospheric conditions prior to contacting with the polymerizable monomer. The process need not be carried out in vacuo.

The monomer must be susceptible to cationic polymerization. The contact process, during which polymer is grown on the surface of the exposed regions, can be carried out either in the vapor phase or in solution. Film ranging from a few angstroms to several microns in thickness can be grown by this process. Organometallic monomers are particularly useful and form polymers which are particularly resistant to plasma etching.

The dry etching step is used to etch the areas of the substrate or planarizing polymer film where the polymer has not grown. A common method of dry etching employs plasma such as oxygen or halocarbon plasma, or reactive ion etching (RIE).

The process employed in the present invention has several distinct advantages over the prior art. Radiation grafting via radical processes has been employed in this regard. This process is sensitive to oxygen and must, therefore, be carried out in vacuo or under inert atmosphere to preserve the reactive radical species. The cationic initiator species of the present invention are not oxygen sensitive; hence, the process can be carried out in a normal ambient. The radical grafting process demands the use of a radiation sensitive polymer and in this process, the grafted polymer is covalently attached to the radiation sensitive polymer. In the present invention, no host polymer is required, and if one is used, it can be chosen for optimal coating, planarizing and adhesion characteristics rather than radiation sensitivity.

The composition of the present invention can also take many forms. The cationic photoinitiator can be any of several known in the art. These include, but are not restricted to, triarylsulfonium salts, with or without dye sensitizers, diaryliodonium salts with or without dye sensitizers, aryl diazonium salts, trihalomethyltriazenes and others. Host polymers useful in this invention are many. Examples include polystyrene, poly(p-methoxystyrene), polycarbonates, butvar and others. The polymerizable monomers include, but are not restricted to, compounds from the following classes: a) epoxides, vinyl ethers, substituted styrenes and $\alpha$-methylstyrenes and cyclosiloxanes. The organometallic element useful in this invention include but are not restricted to silicon, germanium and tin.

A PREFERRED EMBODIMENT

A $4\mu$ thick film of photoresist was spin coated onto a silicon substrate and baked at 200° C. for two hours. This organic substrate was spin coated with a $0.2\mu$ film of poly(p-methoxystyrene) containing triphenyl sulfonium hexafluoro arsenate (1% to 25% by weight). The film was exposed through a mask to 254 nm radiation (dose: 4 mJ/cm$^2$) under typical laboratory atmospheric conditions. The exposed film was transferred to a closed reaction vessel which was evacuated, then filled with vapors of $\gamma$-glycidoxypropyltrimethoxysilane and allowed to stand for 10 minutes. The vessel was then evacuated, refilled with N$_2$ and the film was removed and transferred into a Tegal parallel plate etch tool. The relief image was fully developed after two hours at 100 watts R.f., at 50 m Torr at 20 SCCM of oxygen. High quality images were obtained without loss of thickness in the exposed areas.

In a second preferred embodiment, a 4-micron thick film of hardened photoresist on a silicon wafer was coated with a 0.5μ film of poly(p-methoxystyrene) containing 20 weight % of di-(p-t-butyl phenyl) phenylsulfonium hexafluoro arsenate. The resulting structure was imagewise exposed to 14 mJ/cm$^2$ of deep UV light. It was then immersed in a 5% solution of 4-vinylphenyl t-butyldimethylsilyl ether in petroleum ether for one minute. It was removed, blown dry and then baked for 5 minutes at 100°. The oxygen plasma development was accomplished as before (80 minutes) to give a high resolution, high aspect ratio image of the mask without thickness loss in the exposed areas.

Only preferred embodiments of the invention have been described above, and one skilled in the art will recognize that numerous substitutions, modifications and alterations are permissible without departing from the spirit and scope of the invention, as demonstrated in the following claims.

We claim:

1. A process for generating a negative tone resist image comprising the steps of:
    (1) coating a substrate with a film that contains a cationic photoinitiator;
    (2) exposing the film in an imagewise fashion to radiation and thereby generating cationic initiator in the exposed regions of the film;
    (3) treating the exposed film with a cationicsensitive monomer to form a film of polymer resistant to plasma etching; and
    (4) developing the resist image by etching with a plasma.

2. A process as claimed in claim 1 wherein the cationic photoinitiator is applied from solution.

3. A process as claimed in claim 1 wherein the cationic photoinitiator is applied by an evaporative technique.

4. A process as claimed in claim 1 wherein the cationic photoinitiator is dispersed within a carrier polymer.

5. A process as claimed in claim 4 where the carrier polymer is poly(p-methoxystyrene).

6. A process as claimed in claim 1 where the cationic photoinitiator is a triarylsulfonium salt.

7. A process as claimed in claim 1 where the cationic photoinitiator is a trihalomethyltriazine.

8. A process as claimed in claim 1 wherein the monomer is an epoxy substituted siloxane or silane.

9. A process as claimed in claim 1 wherein the monomer is a styrene silyl ether.

10. A process as claimed in claim 1 wherein the monomer is a silyl substituted vinyl ether.

11. A process as claimed in claim 1 where the monomer is dissolved in a solvent.

12. A process as claimed in claim 1 wherein the monomer is in the vapor state.

13. A process as claimed in claim 1 where the substrate is silicon.

14. A process as claimed in claim 1 wherein the substrate is a planarizing polymer.

* * * * *